United States Patent [19]

Ding et al.

[11] Patent Number: 5,814,563
[45] Date of Patent: Sep. 29, 1998

[54] METHOD FOR ETCHING DIELECTRIC USING FLUOROHYDROCARBON GAS, NH₃-GENERATING GAS, AND CARBON-OXYGEN GAS

[75] Inventors: Ji Ding, Campbell; Hongching Shan, San Jose; Michael Welch, Livermore, all of Calif.

[73] Assignee: Applied Materials, Inc., Santa Clara, Calif.

[21] Appl. No.: 660,966

[22] Filed: Jun. 12, 1996

Related U.S. Application Data

[63] Continuation-in-part of Ser. No. 639,388, Apr. 29, 1996.
[51] Int. Cl.⁶ .................................................. H01L 21/302
[52] U.S. Cl. ......................... 438/714; 438/723; 438/724; 438/738; 438/715
[58] Field of Search ............................ 156/646.1, 644.1, 156/643.1; 216/67; 438/714, 715, 723, 724, 738

[56] References Cited

U.S. PATENT DOCUMENTS

| | | | |
|---|---|---|---|
| 4,427,516 | 1/1984 | Leinstein et al. .................. | 204/192 E |
| 4,615,764 | 10/1986 | Bobbio et al. ..................... | 438/723 |
| 4,654,112 | 3/1987 | Douglas et al. ................... | 156/643 |
| 4,807,016 | 2/1989 | Douglas ............................ | 438/723 |
| 5,021,121 | 6/1991 | Groechel et al. ................. | 156/643 |
| 5,234,537 | 8/1993 | Nagano et al. ................... | 156/643 |
| 5,242,538 | 9/1993 | Hamrah et al. ................... | 156/643 |
| 5,272,115 | 12/1993 | Sato .................................. | 437/228 |
| 5,290,383 | 3/1994 | Koshimizu ........................ | 156/345 |
| 5,302,236 | 4/1994 | Tahara et al. ..................... | 156/643 |
| 5,302,240 | 4/1994 | Hori et al. ........................ | 156/643 |
| 5,308,742 | 5/1994 | Ta ..................................... | 430/313 |
| 5,322,590 | 6/1994 | Koshimizu ........................ | 156/626 |
| 5,356,515 | 10/1994 | Tahara et al. ..................... | 156/643 |
| 5,445,710 | 8/1995 | Hori et al. ........................ | 156/643.1 |
| 5,595,627 | 1/1997 | Inazawa et al. .................. | 438/723 |

*Primary Examiner*—R. Bruce Breneman
*Assistant Examiner*—Anita Alanko
*Attorney, Agent, or Firm*—Ashok K. Janah; Peter J. Sgarbossa

[57] ABSTRACT

A method of etching a dielectric layer (20) on a substrate (25) with high etching selectivity, low etch rate microloading, and high etch rates is described. In the method, a substrate (25) having a dielectric layer (20) with resist material thereon, is placed in a process zone (55), and a process gas is introduced into the process zone (55). The process gas comprises (i) fluorohydrocarbon gas for forming fluorine-containing etchant species capable of etching the dielectric layer (20), (ii) NH₃-generating gas having a liquefaction temperature $L_T$ in a range of temperatures $\Delta T$ of from about −60° C. to about 20° C., and (iii) carbon-oxygen gas. The temperature of substrate (25) is maintained within about ±50° C. of the liquefaction temperature $L_T$ of the NH₃-generating gas. A plasma is formed from the process gas to etch the dielectric layer (20) on the substrate (25). Preferably, the volumetric flow ratio of fluorohydrocarbon:NH₃-generating gas is from about 2.5:1 to about 7:1.

13 Claims, 5 Drawing Sheets

METHOD FOR ETCHING DIELECTRIC USING FLUOROHYDROCARBON GAS, NH$_3$-GENERATING GAS, AND CARBON-OXYGEN GAS

CROSS-REFERENCE

This patent application is a continuation-in-part of patent application Ser. No. 08/639,388, to Bryan Pu, et al., filed on Apr. 29, 1996, entitled Method for Etching Dielectric Layers with High Selectivity and Low Microloading, which is incorporated herein by reference.

BACKGROUND

The present invention relates to a process for etching substrates, and in particular, for etching dielectric layers, such as silicon dioxide, on semiconductor substrates.

In integrated circuit fabrication, it is often desirable to etch electrically insulative dielectric layers, such as silicon dioxide, undoped silicate glass, phosphosilicate glass (PSG), borophosphosilicate glass (BPSG), Si$_3$N$_4$, or TEOS deposited glass, that are used to electrically isolate devices or features formed on the substrate. For example, the dielectric layer can be deposited on a monocrystalline silicon substrate; a polysilicon layer on the substrate; or on anti-reflective or diffusion barrier layers, such as titanium silicide or titanium nitride. As another example, the dielectric layer can be deposited on electrically conductive interconnect lines that are used to electrically connect devices formed on semiconductor substrates. To etch the dielectric layer, resist material is deposited on the dielectric layer and patterned using photolithographic methods to the desired configuration of holes or lines. Holes are etched though the exposed portions of the insulative dielectric layers to the underlayers, such as silicon, polysilicon, titanium silicide, or titanium nitride layers. The etched holes are filled with electrically conductive material to form vertical electrically conductive interconnects, commonly known as contact holes or vias, which connect devices formed on the substrate or interconnect lower levels of interconnect lines to upper levels of interconnect lines.

In conventional etching processes, the dielectric layer is etched using a plasma of fluorocarbon gases, including for example, CHF$_3$, CH$_3$F, CF$_4$, and CH$_2$F$_2$. For example, commonly assigned U.S. Pat. No. 5,242,538, which is incorporated herein by reference, discloses one preferred etchant gas composition comprising CH$_3$F, CF$_4$, argon, and NH$_3$. The NH$_3$ gas is used in an amount ranging from about 5 to 20%, and more preferably about 10%, by volume of the total gas flow, to serve as a source of hydrogen radicals in the etching process. However, such conventional gas compositions do not provide dielectric etch rates exceeding 700 to 900 nm/minute, and often do not allow simultaneous control of the etch rate, etching selectivity ratio, and etch profile angle. Tailoring the gas composition to provide high etch rates results in low etching selectivity ratios and unacceptable etch profile angles, or vice versa. Modern integrated circuits often require etching selectivity ratios of greater than 10:1 with respect to the resist, and greater than 20:1 with respect to polysilicon, WSi$_x$, and TiSi$_x$. The etching selectivity ratio is the ratio of the dielectric etch rate to the rate of etching of the overlying resist layer, or the underlying silicon, polysilicon, titanium silicide, or titanium nitride layer. The etch profile angle, i.e., the angle between the sidewall of the etched feature and the plane of the substrate, is ideally about 90° to provide features having straight and substantially perpendicular sidewalls. However, conventional etching processes often provide profile angles of less than 85°.

Another problem with many conventional etching processes is that such processes can often only be operated in a narrow processing window, i.e., in a narrow range of process conditions that provide adequate etching characteristics. It is generally desirable to have a more tolerant etching process that operates in a wider range of processing conditions to allow tailoring the process conditions to achieve particular combinations of etching rates and etching selectivity ratios for different types of materials on the substrate.

It is also desirable for the etchant gas to provide dissociated carbon species that form polymeric byproduct deposits, commonly known as "passivating" layers, on the sidewalls of freshly etched features, to limit etching of the sidewalls and provide "anisotropic" etching. However, excessive deposition of passivating layers on the sidewalls of the etched features is undesirable, and can result in lower dielectric etching rates, that typically range from about 250 to 300 nm/minute.

Thus, there is a need for an etching process that provides high etching rates and good etching selectivity ratios. It is also desirable for the etching process to provide uniform profile angles of at least about 85°. It is further desirable for the etching process to be operated effectively in a wide range of process conditions to allow tailoring of process conditions for particular combinations of materials.

SUMMARY

The present invention is directed to a method of etching a substrate having a dielectric layer with resist thereon, at high etch rates, with good etching selectivity, and capable of being operated in a wide range of processing conditions. In the method, the substrate is placed in a process zone and process gas is introduced into the process zone. In one version, the process gas comprises (i) fluorohydrocarbon gas capable of forming fluorine-containing etchant species for etching the dielectric layer, (ii) NH$_3$-generating gas having a liquefaction temperature L$_T$ in a range of temperatures ΔT of from about −60° C. to about 20° C., and (iii) carbon-oxygen gas. The temperature of the substrate is maintained within about ±50° C. of the liquefaction temperature L$_T$ of the NH$_3$-generating gas. A plasma is formed from the process gas to etch the dielectric layer on the substrate. It is believed that at least a portion of the NH$_3$-generating gas forms NH$_3$ chemical species that adhere to the substrate surface at the liquefaction temperatures to enhance the etching rate of the dielectric layer through surface reactions on the substrate.

The etching process provided unexpectedly high dielectric etch rates up to about 900 nm/minute in combination with excellent etching selectivity ratios. The unexpected etching properties were obtained by maintaining the volumetric flow ratio of the fluorohydrocarbon:NH$_3$-generating gas within a range of about 2.5:1 to about 7:1. Furthermore, wide etching processing windows were obtained when carbon-oxygen gas was added. Preferably, the volumetric flow ratio of carbon-oxygen: fluorohydrocarbon gas was maintained at >0.1:1 and ≦1:1.

A preferred etchant gas composition comprises (i) fluorohydrocarbon gas selected from the group consisting of CH$_3$F, CHF$_3$, C$_2$HF$_5$, C$_2$H$_2$F$_2$, and C$_2$H$_4$F$_2$, and more preferably CHF$_3$; and (ii) fluorocarbon gas selected from the group consisting of CF$_4$, C$_2$F$_6$, C$_3$F$_8$, C$_4$F$_8$, and C$_4$F$_{10}$, and more preferably CF$_4$. The NH$_3$-generating gas can comprise $NH_3$, $NH_4OH$, $CH_3NH_2$, $C_2H_5NH_2$, $C_3H_8NH_2$, and mixtures thereof, of which $NH_3$ is preferred. The carbon-oxygen gas can comprise CO, $CO_2$, HCOOH, HCOH, $CH_3COOH$, $CH_3OH$, and mixtures thereof, of which CO is preferred. An inert gas, such as argon, capable of being activated by the plasma to sputter material from the substrate can also be added to the process gas to further enhance etch rates and provide anisotropic etching.

BRIEF DESCRIPTION OF DRAWINGS

These and other features, aspects, and advantages of the present invention will be better understood from the following drawings, description and appended claims, which illustrate examples of the invention, where:

DESCRIPTION

Figure 1A:
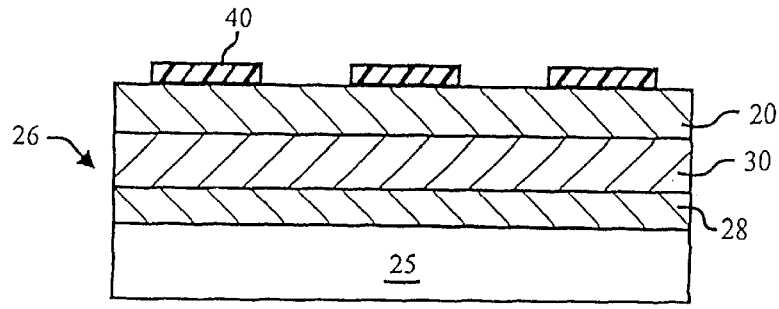
FIG. 1a is a schematic in vertical cross-section of a dielectric layer covering a substrate.
Figure 1B:
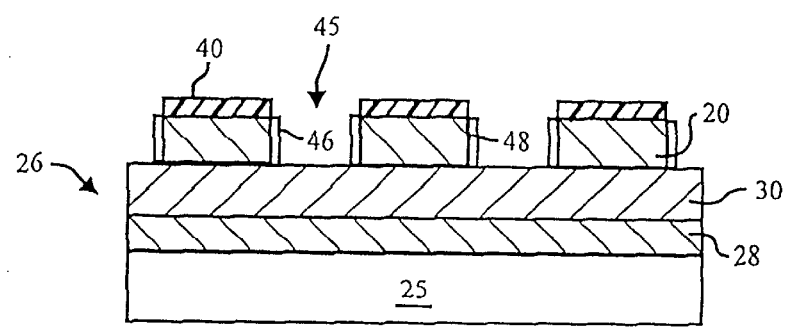
FIG. 1b is a schematic in vertical cross-section of the substrate of FIG. 1a after etching of the dielectric layer showing substantially anisotropically etched contact holes.
Figure 1C:
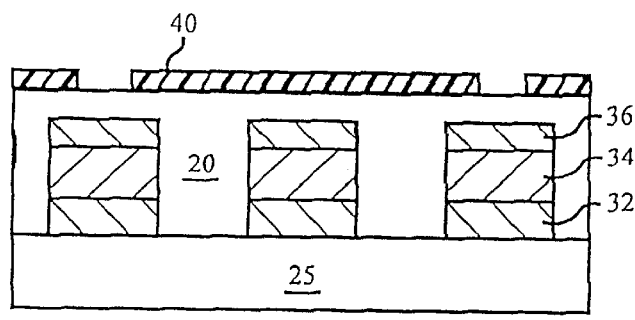
FIG. 1c is a schematic in vertical cross-section of a dielectric layer covering electrically conductive interconnection lines on a substrate.
Figure 1D:
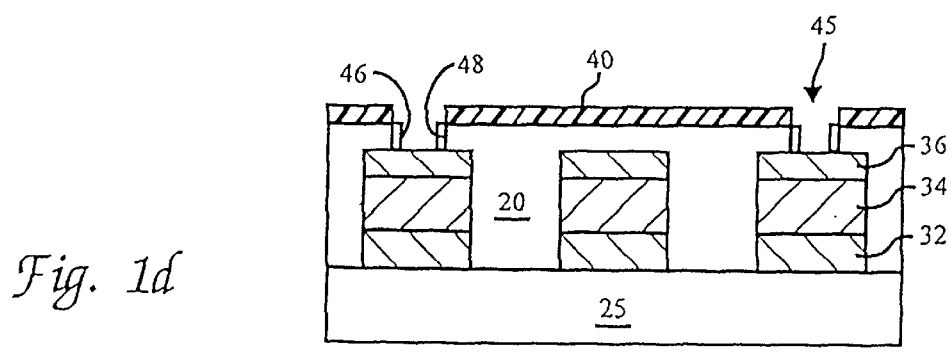
FIG. 1d is a schematic in vertical cross-section of the substrate of FIG. 1c after etching of the dielectric layer showing substantially anisotropically etched vias.

The etching process of the present invention is useful for etching dielectric 20 on a substrate 25, as shown in FIGS. 1a–1d, with high etching selectivity and good etch rates. The substrate 25 can be made of any material, such as glass, ceramic, metal, polymer, or semiconductor substrates, such as a silicon or gallium arsenide wafers. The dielectric 20 on the substrate 25 typically comprises a layer of silicon oxide, phosphosilicate glass (PSG), or borophosphosilicate glass (BPSG), having thickness of about 400 to 1500 nm. The dielectric layer 20 can also comprise plurality of layers, such as for example, a silicon oxide layer having a thickness of about 100 to 500 nm, covered by a 300 to 800 nm BPSG layer. The dielectric layer 20 is used to electrically isolate devices or interconnect lines formed on the substrate 25. For example, the dielectric layer 20 can be deposited on an underlayer 26, such as a doped polysilicon layer 28 or a diffusion layer 30, to electrically isolate the underlayer 26, as shown in FIG. 1a. Dielectric layers 20 are also used to cover etched interconnect lines that include (i) a lower diffusion barrier layer 32, such as titanium, tungsten, titanium-tungsten or titanium nitride; (ii) an electrically conductive layer 34 comprising aluminum, copper and silicon; and (iii) an anti-reflective layer 36, such as silicon, titanium nitride or titanium-tungsten, as shown in FIG. 1c, each of the layers being typically from about 200 nm to about 1000 nm thick. Although the etching method of the present invention is illustrated for etching of dielectric layers, the etching method can also be used to etch films which include non-oxide layers such as silicon, polysilicon, silicide, nitride, or boride layers, for example, $Ta_2O_5$, $TiO_2$, TiN, $WSi_x$, and $MoSi_x$. Thus, the present invention should not be limited to etching of dielectric layers.

Typically, a photoresist 40, such as "RISTON," manufactured by duPont de Nemours Chemical Company, is applied on the dielectric layer 20, to a thickness of about 0.4 to about 1.3 micron, and the features 45 to be etched in the insulative dielectric layer, such as contact holes or vias, are defined using conventional lithographic processes in which the resist is exposed to a pattern of light through a mask that corresponds to the desired configuration of features 45. The dielectric layer 20 underlying the unexposed portions of the resist are etched in the etching process. During the etching process, polymeric passivating deposits 46 are typically formed on the sidewalls 48 of the etched features 45. The etched features 45 are typically sized from about 0.2 to about 10 microns, and more typically about 0.4 to 2 microns, and the spacing between the features is typically from 0.2 microns to 10 microns.

Figure 2:
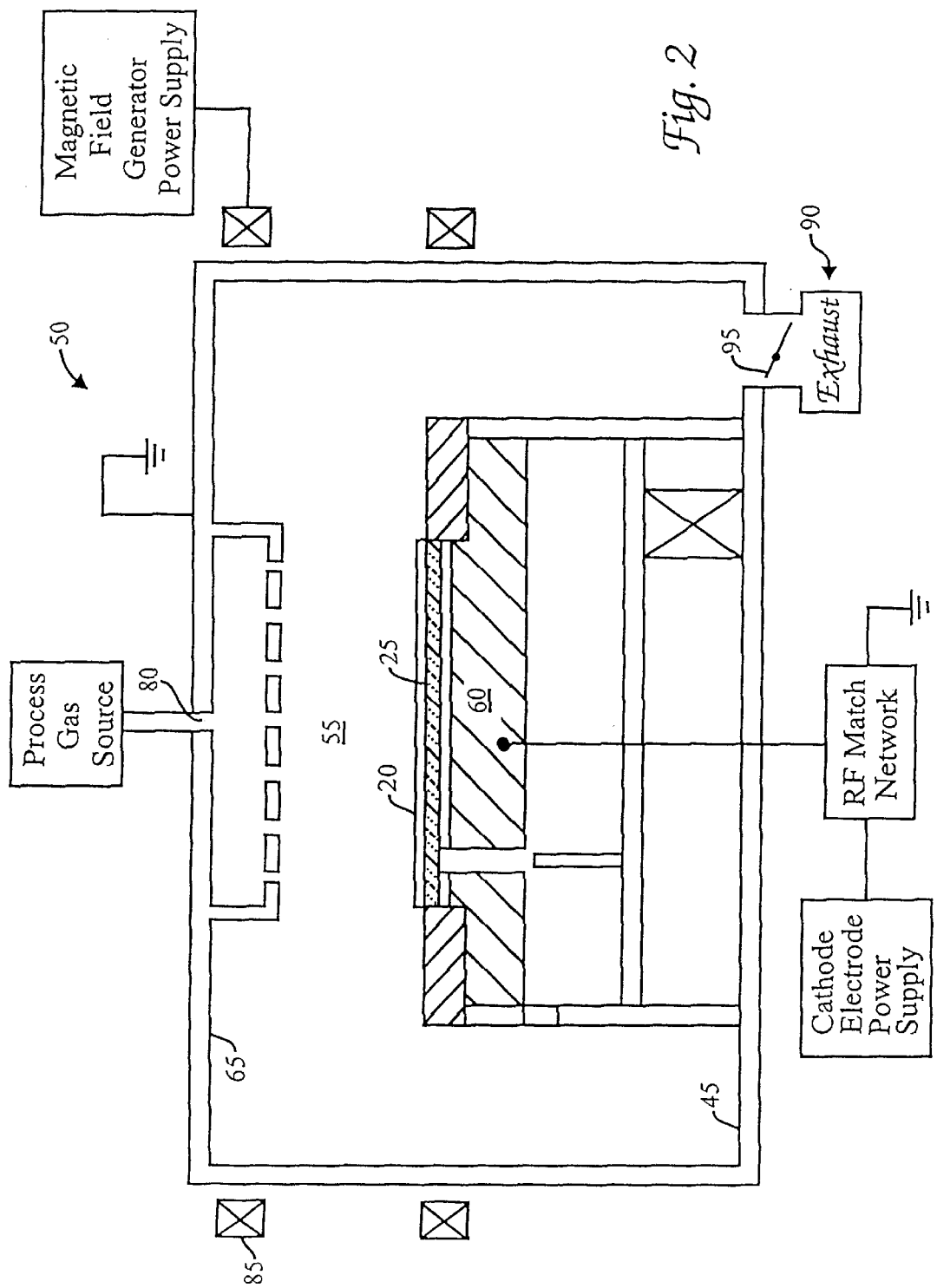
FIG. 2 is a schematic view in vertical cross-section of a process chamber suitable for practicing the etching process of the present invention.

In the present process, the dielectric layer 20 on the substrate 25 is etched in a process chamber 50, such as for example, an MxP OXIDE ETCH chamber, commercially available from Applied Materials Inc., Santa Clara, Calif., as shown in FIG. 2, and generally described in commonly assigned U.S. Pat. Nos. 4,842,683 to Cheng, et al., and 4,668,338 to Maydan, et al., both of which are incorporated herein by reference. The particular embodiment of the process chamber 50 shown herein, is suitable for processing of semiconductor substrates 25, is provided only to illustrate the invention, and should not be used to limit the scope of the invention. For example, the etching process of the present invention can be used to etch any substrate 25, and can be used for manufacturing processes other than semiconductor fabrication.

To perform the process, the chamber 50 is evacuated to a pressure of less than about 1 mTorr, and a substrate 25 is transferred to a plasma zone 55 of the chamber 50 from a load lock transfer chamber (not shown) maintained at vacuum. Typically, the plasma zone 55 comprises a volume of at least about 5,000 cm$^3$, and more preferably from about 10,000 to about 50,000 cm$^3$. The substrate 25 is placed on a support that also serves as a cathode electrode 60, and the sidewalls of the chamber 50 are electrically grounded to form an anode electrode 65. The substrate 25 an be held in place during the etching process using a mechanical or electrostatic chuck (not shown) with grooves in which a coolant gas, such as helium, is held to control the temperature of the substrate.

Process gas is introduced into the chamber 50 through a gas distributor 80 peripherally disposed about the substrate 25, and the chamber 50 is maintained at a pressure ranging from about 1 to about 1000 mTorr, and more typically from 10 to 300 mTorr. An electric field is maintained in the plasma zone 55 to form a plasma from the process gas (i) inductively by applying an RF current to an inductor coil (not shown) encircling the process chamber 50, (ii) capacitively by applying an RF current to the cathode and anode electrodes 60, 65 in the process chamber 50, or (iii) both inductively and capacitively. In reactive ion etching (RIE) processes, the plasma is typically capacitively generated by applying an RF voltage at a power level of from about 100 to about 2000 Watts to the cathode electrode 60, and by electrically grounding the anode electrode 65. Alternatively, an RF current at a power level of from about 750 Watts to about 2000 Watts can be applied to an inductor coil to inductively couple energy into the chamber 50 to generate the plasma in the plasma zone 55. The frequency of the RF current applied to the process electrodes 60, 65 or inductor coil is typically from about 50 Khz to about 60 MHz, and more typically about 13.56 MHz.

The plasma can also be enhanced using electron cyclotron resonance or magnetically enhanced reactors, in which a magnetic field generator 85, such as a permanent magnet or electromagnetic coils, is used to apply a magnetic field in the plasma zone 55 to increase the density and uniformity of the plasma in the plasma zone 55. Preferably, the magnetic field comprises a rotating magnetic field with the axis of the field rotating parallel to the plane of the substrate 25, as described in U.S. Pat. No. 4,842,683, issued Jun. 27, 1989, which is incorporated herein by reference. The magnetic field in the chamber 50 should be sufficiently strong to increase the density of the ions formed in the plasma, and sufficiently uniform to reduce charge-up damage to features 45 such as CMOS gates. Generally, the magnetic field as measured on a surface of the substrate 25 is less than about 500 Gauss, more typically from about 10 to about 100 Gauss, and most typically from about 10 Gauss to about 60 Gauss.

Spent process gas and etchant byproducts are exhausted from the process chamber 50 through an exhaust system 90 capable of achieving a minimum pressure of about $10^{-3}$ Torr in the process chamber. A throttle valve 95 is provided in the exhaust for controlling the pressure in the chamber 50. Also, an optical endpoint measurement technique is typically used to determine completion of the etching process for a specific layer by measuring the change in light emission of a particular wavelength corresponding to a detectable gaseous species. A sudden decrease or increase in the amount of the detectable species, such as for example, CO or CN, that results from chemical reaction of the process gas with the silicon dioxide or polysilicon layer indicates completion of etching of the dielectric layer 20 and start of etching of the underlayer 26.

The etching process of the present invention uses a process gas that provides high etch rates and highly selective etching of the dielectric layers 20 on the substrate 25. The process gas includes (i) fluorohydro-carbon gas for forming fluorine-containing etchant species capable of etching the dielectric layer 20, and for forming passivating deposits 46 on the substrate 25, (ii) $NH_3$-generating gas for enhancing etching rates of the fluorine-containing etchant species by adsorping onto the surface of the substrate, (iii) carbon-oxygen gas for allowing the etching process to operate in a wider range of processing conditions, and (iv) optionally, an inert gas can be added to the process gas to provide sputtering ions that sputter material from the substrate 25. In the etching process, the process gas is introduced into the chamber, and pressure in the chamber is maintained from about 10 to 500 mTorr, and more preferably from about 50 to about 300 mTorr. The RF power applied to the process electrodes 60, 65 is preferably from about 200 to about 2000 Watts, and more preferably from about 400 to about 1200 Watts. Preferred process gas compositions and volumetric flow ratios will now be described.

The fluorohydrocarbon gas is capable of forming fluorine-containing species that etch the dielectric layer 20 on the substrate 25. For example, a silicon dioxide layer is etched by fluorine-containing ions and neutrals, such as F, HF, $F^-$, CF, and $CF_2$ to form volatile $SiF_x$ species that are exhausted from the chamber 50. By fluorohydrocarbon gas it is meant a gas that includes carbon, fluorine, and hydrogen, preferred fluorohydrocarbon gases comprising, for example, $CHF_3$, $CH_3F$, $C_2HF_5$, $CH_2F_2$, $C_2H_4F_2$, and mixtures thereof. The $NH_3$-generating gas is a gas capable of generating $NH_3$-containing species such as gases comprising $NH_2^-$, $NH_3$, or $NH_4^+$, ions or molecules, including for example $NH_3$, $NH_4OH$, $CH_3NH_2$, $C_2H_5NH_2$, $C_3H_8NH_2$, and mixtures thereof. Of these gases, $NH_3$ is preferred for the reasons provided below.

It has been discovered that fluorohydrocarbon gas in combination with $NH_3$-generating gas provides unexpected and surprising results. Although the reaction mechanism is not fully understood it is believed that the following reaction mechanism provides increased etch rates and higher etching selectivity. The $NH_3$-generating gas is selected to have a high sticking coefficient on the dielectric layer 20, of preferably at least about 0.3, and more preferably at least about 0.5. The higher sticking coefficient occurs because the $NH_3$-generating gas has a relatively high liquefaction temperature $L_T$ (compared to that of conventional etchant gases) of at least about $-80°$ C., and more preferably in a range of temperatures $\Delta T$ of from about $-60°$ C. to about $20°$ C. For example, whereas $NH_3$ has a liquefaction temperature of $-33°$ C. and a sticking coefficient of about 0.5; a fluorocarbon gas, such as $CF_4$, has a liquefaction temperature of about $-100°$ C. and a sticking coefficient of less than about 0.1. The higher liquefaction temperatures and higher sticking coefficients are believed to cause at least a portion of gaseous and liquid $NH_3$-generating phases, such as $NH_3$ or $NH_4^+$ species, to adsorb on the substrate 25 during the etching process and react with fluorohydrocarbon gas (for example $CHF_3$), on the surface of the substrate, in the following reactions:

$$2CHF_3 + NH_3 \rightarrow NH_4HF_2 + 2CF_2 \qquad (1)$$

$$2CHF_3 + NH_3 \rightarrow NH_4F + HF + 2CF_2 \qquad (2)$$

The chemical adherence of the highly reactive $NH_4F$, HF, $HF_2$, and $NH_4$ species to the substrate surface 25 results in rapid etching of the dielectric layer 20 because the surface reactions are much faster than gas transport reactions in which relatively slow transport mechanisms limit reaction rates during mass transport of etchant process gas species to the substrate, and etchant byproducts away from the substrate.

During the etching process, the substrate 25 is cooled to temperatures sufficiently low to cause the $NH_3$-generating species to adsorb onto the surface of the substrate 25. The substrate temperatures are actually the temperatures of the support 60 used to support the substrate, which are typically $5°$ to $50°$ C. lower than the true substrate temperatures and are measured by a thermocouple located within the support. Preferably, the substrate 25 is cooled to temperatures that fall in a range of temperatures within about $±50°$ C., and more preferably about $±30°$ C., of the liquefaction temperature $L_T$ of the $NH_3$-generating gas to allow adsorption of the gas on the substrate surface. Thus, for liquefaction temperatures $L_T$ within a range of temperatures $\Delta T$ of from about $-60°$ C. to about $20°$ C. The substrate is maintained at temperatures ranging from about $-110°$ C. to about $70°$ C., and more preferably from about $-90°$ C. to about $50°$ C. Most preferably, the substrate 25 is maintained at temperatures substantially equivalent to the liquefaction temperature $L_T$ of the $NH_3$-generating gas.

Figure 3:
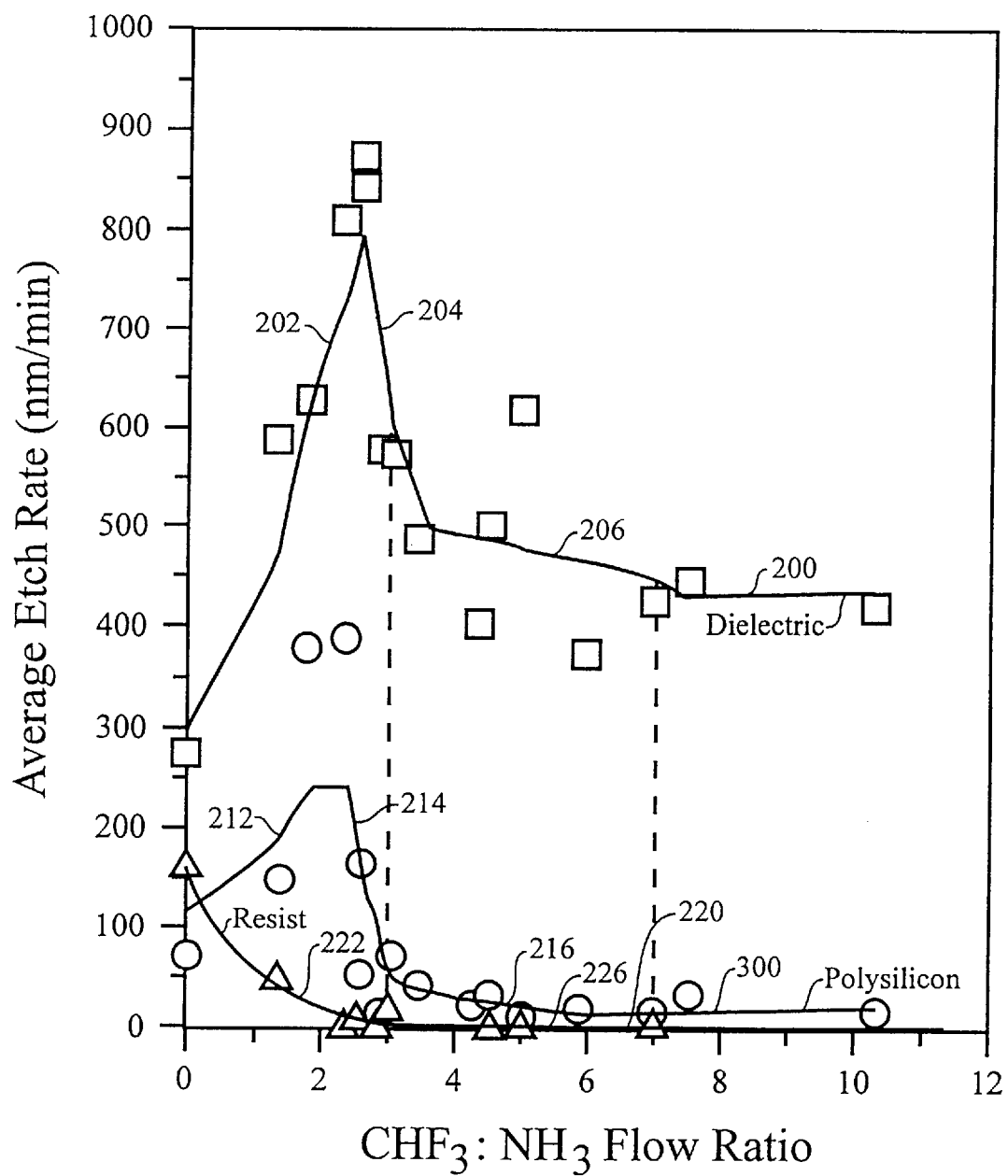
FIG. 3 is a graph showing the change in silicon dioxide, resist, and polysilicon etch rates as a function of the volumetric flow ratio of $CHF_3$ to $NH_3$.

One aspect of the unexpected results obtained from the present process are shown in FIG. 3, which graphs etch rates obtained using a process gas comprising $CHF_3$ and $NH_3$. It is seen that the average etch rates of the dielectric, photoresist 40, and polysilicon layers, vary nonlinearly with increasing flow ratios of $CHF_3$ to $NH_3$. The etch rate of silicon dioxide, rapidly increases at a $CHF_3$:$NH_3$ flow ratio of from 1:0 to about 2:1, as shown by the portion 202 of the curve 200. Thereafter, the silicon dioxide etch rate rapidly decreases as the $CHF_3$:$NH_3$ flow ratio increases from about 2:1 to about 2.5:1, as shown by the portion 204. Of particular interest is the portion 206 of the line 200, corresponding to $CHF_3$:$NH_3$ flow ratios of from about 2.5:1 to about 7:1, where the average etch rate of the silicon dioxide layer remains relatively uniform and stable for a relatively wide range of gas flow ratios.

The average polysilicon etch rates, as shown by line 210 in FIG. 3, exhibits similar behavior with the polysilicon etch rate rapidly increasing for $CHF_3$ to $NH_3$ flow ratios of 0:1 to 2:1, as shown by the portion 212 of the line 210; and thereafter, rapidly decreasing for flow ratios of about 2:1 to about 3:1, as shown by the portion 214. At $CHF_3$:$NH_3$ flow ratios less than about 2.5:1, the high polysilicon etch rates results in excessive etching of the polysilicon layer, and etching selectivity ratios as low as 2:1. In contrast, for $CHF_3$ to $NH_3$ flow ratios of about 2.5:1 to about 7:1, the etch rate of polysilicon is low and relatively stable, as shown by the portion 216.

The resist etch rate, as shown by the line 220 of FIG. 3, initially rapidly decreases for $CHF_3$:$NH_3$ flow ratios between 0:1 to 3:1, as shown by the portion 222, and thereafter, more gradually decreases to zero, as shown by the portion 226. Operation of the etching process in the portion 222, at low $CHF_3$:$NH_3$ flow ratios of less than 2.5:1, would provide narrow processing windows because the dielectric etch rates changes rapidly for small changes in process gas flow rates, and normal flow rate fluctuations would cause significant variability in etch rates between different process runs. Also, the high resist etching rates at these flow ratios can result in resist faceting, and etching of the dielectric layer 20 below the resist.

FIG. 3 demonstrates that a fluorohydrocarbon to $NH_3$-generating gas flow ratios of from about 2.5:1 to about 7:1, and more preferably from 3:1 to 6:1, provides stable and high etch rates of at least about 400–500 nm/minute, while simultaneously providing good etching selectivity ratios for etching of silicon dioxide relative to resist and polysilicon. These flow ratios correspond to the portion 206 of the $SiO_2$ etch rate line 200, the portion 216 of the polysilicon etch rate line 210, and the portion 222 of the resist etch rate line 220. In these portions of the etching rate lines, the low polysilicon and resist etch rates provide high etching selectivity ratios; while simultaneously the dielectric etch rates are maintained at relatively high levels. Also, the dielectric polysilicon and resist etching rates remain relatively stable and uniform over a wide range of gas flow ratios to provide a wide processing window. These unexpected results demonstrate the importance of using a $CHF_3$ and $NH_3$ combination in the specified volumetric flow ratios to provide optimal etching rates and etching selectivity ratios.

Figure 4:
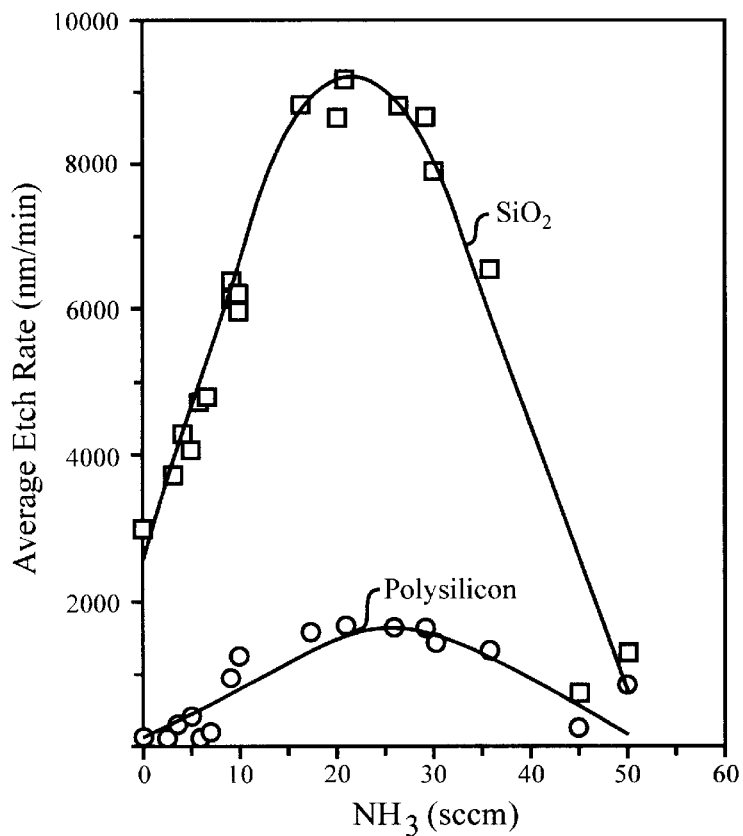
FIG. 4 is a graph showing the change in silicon dioxide and polysilicon etch rates for increasing flow rates of $NH_3$ gas.
Figure 5:
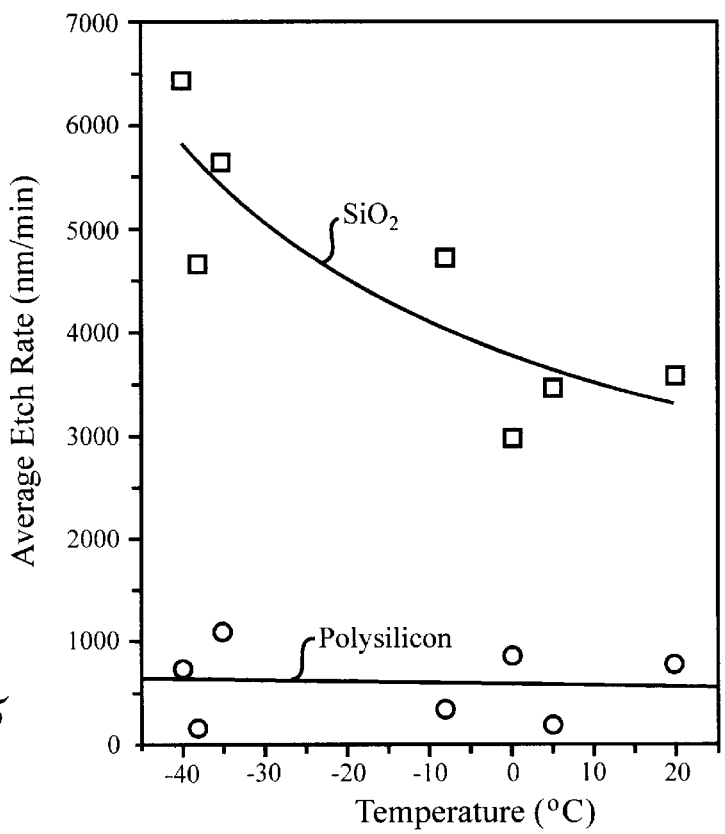
FIG. 5 is a graph showing the change in silicon dioxide and polysilicon etch rates as a function of the temperature of the support holding the substrate.

With reference to FIGS. 4 and 5, it is seen that the dielectric etch rate varies non-linearly as a function of the flow rate of $NH_3$-generating gas, and the temperature of the support holding the substrate (commonly referred to as substrate temperature). FIG. 4 shows that the average $SiO_2$ dielectric etch rates vary in the form of an upside down U-shaped curve, with dielectric etch rates increasing for $NH_3$ flow rates from 0 to 25 sccm, and decreasing for $NH_3$ flow rates from 25 to 50 sccm. Similarly, the polysilicon etch rates also peak at an $NH_3$ flow rate of about 25 sccm, although to a lesser degree. The unusual upside down U-shaped variation in etch rates for increasing flow of $NH_3$ is not anticipated from the prior art, and demonstrates the unexpected results of the present invention.

FIG. 5 shows the change in average dielectric and polysilicon etch rates as a function of increasing substrate temperature. It is seen that while the etch rate of the $SiO_2$ dielectric layer 20 decreases with increasing temperature, the etching rate of the polysilicon layer, which affects the etching selectivity ratio, does not significantly change for increasing temperatures. This graph demonstrates that the substrate temperature significantly affects the etching rates, and higher substrate temperatures can be used to slow down the rate of etching of the dielectric layer 20 during etching of thin dielectric layers, such as BPSG or silicon dioxide layers. Also, a relatively wide temperature range can be used without sacrificing the etching selectivity ratios, which does not significantly change with increasing temperatures.

Figure 6:
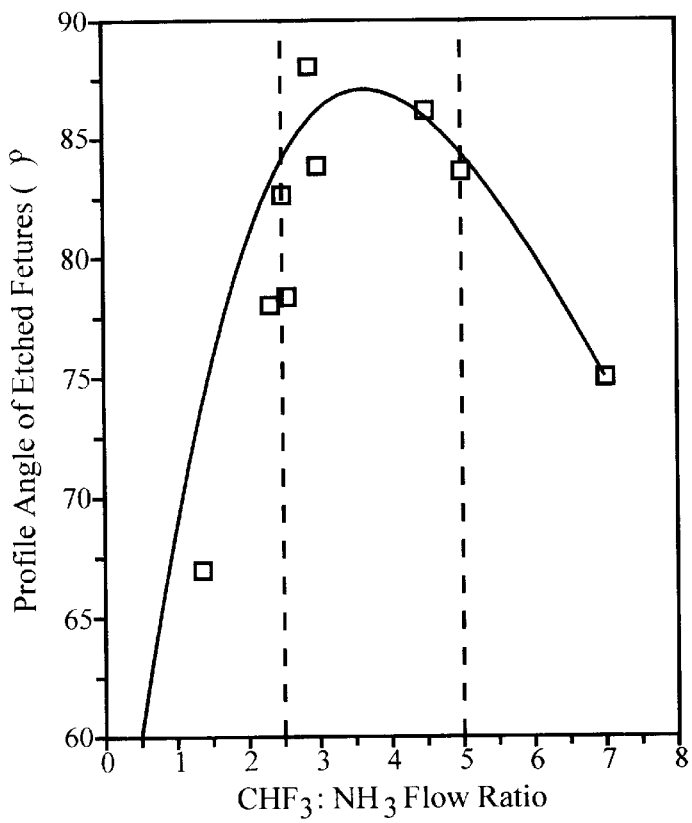
FIG. 6 is a graph showing the change in profile angle for etched features as a function of the volumetric flow ratio of $CHF_3$ to $NH_3$.

Further evidencing the unusual etching characteristics of the fluorohydrocarbon and $NH_3$-generating gas mixture, is the variation in profile angle of etched features 45, as a function of increasing flow ratio of fluorohydrocarbon to $NH_3$-generating gas, as shown in FIG. 6. The profile angle of the etched features were measured using the average value of multiple measurements of etched contact holes having diameter of about 0.8 $\mu$m, at both the center and edge of the wafer, using SEM (Scanning Electron Microscope) photographs of cross-sections of the etched substrate 25. It was observed that at low flow ratios of $CHF_3$:$NH_3$, namely at flow ratios less than about 2.5:1, the profile angles of the etched features 45 are typically less than 80°, and often as low as 70°. Furthermore, $CHF_3$:$NH_3$ flow ratios higher than 5:1 also provided low profile angles of less than about 75°. In contrast, $CHF_3$:$NH_3$ volumetric flow ratios ranging from 2.5:1 to 5:1 provided optimal profile angles typically ranging from about 80° to about 90°, and more typically from about 85° to 90°.

For these reasons, the volumetric flow ratio of fluorohydrocarbon:$NH_3$-generating gas is selected specifically for particular material combinations to provide (i) a dielectric etch rate of at least about 500 nm/minute, (ii) a dielectric to resist etching selectivity ratio of at least about 10:1, and more typically at from 100:1 to $\infty$:1, and (iii) a dielectric to underlayer etching selectivity ratio of at least about 25:1. The volumetric flow ratio of fluorohydrocarbon:$NH_3$-generating gas can also be adjusted so that the etched features 45 have profile angles of at least about 85°. As described above, preferred volumetric flow ratios of fluorohydrocarbon:$NH_3$-generating gas that provide high etch rates, good etching selectivity, and excellent profile angles, are from about 2.5:1 to about 7:1, and more preferably are from 3:1 to about 6:1. Although, preferred ranges of volumetric flow ratios are described herein, it should be understood that the volumetric flow ratios can be tailored for different combinations of materials, and to achieve specific etching selectivities, etch rates, or etched feature geometries, for example aspect ratios or profile angles, without deviating from the scope of the present invention.

It is further discovered that the addition of carbon-oxygen gas to the etchant process gas allows the etching process to operate in a wide range of processing conditions, including broad ranges of process gas flow rates, pressures, temperatures, and RF power levels. Preferred carbon-oxygen gases include CO, $CO_2$, HCOOH, HCOH, $CH_3COOH$, and $CH_3OH$. The carbon-oxygen gas typically reacts with fluorine-containing species to form volatile $COF_2$, thereby reducing the fluorine concentration in the process chamber 50 and consequently reducing the rate of etching of polysilicon to provide higher etching selectivity ratios. In addition, the carbon-oxygen gas enhances the formation of free carbon and $CF_2$ species that react with other species, such as nitrogen, fluorine, and boron to form polymeric passivating deposits 46 on the sidewalls of the etched features 45 to provide anisotropic etching of the dielectric layer. However, excessively high flow rates of the carbon-oxygen gas can cause thick passivating deposits 46 to form on the substrate 25 resulting in lower dielectric etch rates. Thus, preferably the flow rate of carbon-oxygen gas is maintained lower than, or substantially equal to, the flow rate of the fluorohydrocarbon gas to provide sufficient fluorine-containing species to rapidly etch the substrate 25, while providing high etching selectivity and anisotropic etching. More preferably, the volumetric flow ratio of the carbon-oxygen gas:fluorohydrocarbon is at least about 0.1:1 and less than or equal to about 1:1.

Figure 7:
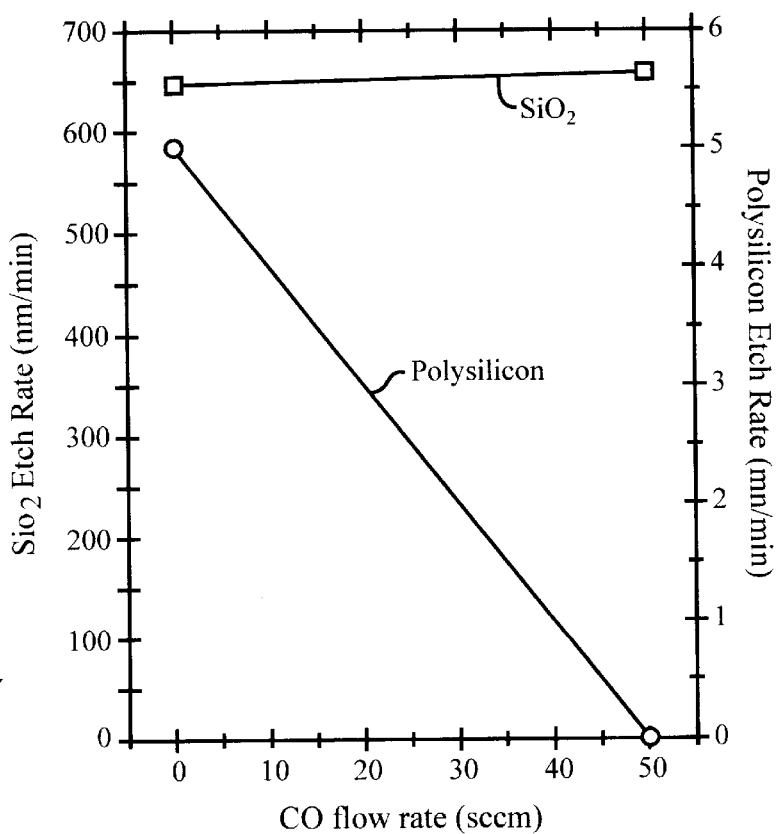
FIG. 7 is a graph showing the change in silicon dioxide and polysilicon etch rates for increasing flow rates of CO gas.

The addition of carbon-oxygen gas to the process gas substantially improves the processing window of the etching process, allowing the process to be operated in a wider range of process conditions. With reference to FIG. 7, it is seen that increasing flow rates of the carbon-oxygen gas results in a substantial reduction of the polysilicon etch rate from about 5 nm/minute to almost 0 nm/minute, while simultaneously maintaining the silicon dioxide etch rate substantially constant at about 650 nm/minute. Thus, the addition of carbon-oxygen gas significantly increases the etching selectivity ratio of silicon dioxide with respect to polysilicon while maintaining high and uniform silicon dioxide etch rates. This allows tailoring the process gas composition by increasing the flow rate of the CO gas to achieve desired etching characteristics while maintaining high dielectric etch rates over a wide range of process conditions.

Preferably, inert gas is added to the process gas to provide increased anisotropic etching through highly directional bombardment of the substrate 25 by charged inert gas species that are energized by the electric field in the chamber 50. The inert gas also assists in sputtering-off the passivating deposits 46 on the sidewalls of the freshly etched features 45 to reduce the thickness of such deposits 46. It is also desirable for the inert gas to have a wide range of excitation energies, so that the inert gas can ionize to form ionized metastable states that promote energy transfer reactions which promote dissociation of the process gas. Suitable inert gases include argon, helium, neon, xenon, and krypton, of which argon is preferred. Sufficient inert gas is added to the process gas to provide the desired anisotropic etching levels and to enhance disassociation of the process gas. However, excessive inert gas flow rates can cause excessive sputtering of the resist on the substrate 25, resulting in resist faceting and etching of the dielectric layer 20 underlying the resist. The charged argon ions also enhance the reaction rates of the $NH_3$ or $NH_4$ species adsorbed on the surface of the substrate 25 by ion bombardment to provide good anisotropic etching characteristics. For these reasons, the volumetric flow ratio of inert gas to $CHF_3$ is preferably from about 0.1:1 to about 10:1, and more preferably from 1:1 to about 3:1.

In a preferred aspect of the present invention, the process gas comprises a mixture of (i) fluorohydrocarbon gas, and (ii) fluorocarbon gas that are absent hydrogen, such as $CF_4$, $C_2F_6$, $C_3F_8$, $C_4F_8$ and $C_4F_{10}$. It has been discovered that a combination of the fluorohydrocarbon and fluorocarbon gases provides optimum etch rates and etching selectivity ratios. Although the gas chemistry is not fully understood, it is believed that the fluorohydrocarbon gas provides hydrogen species that combine with free fluorine radicals to form gaseous HF that is exhausted from the chamber 50 to increase the carbon available to form passivating deposits 46, and limiting the fluorine species available for etching the dielectric 20. In contrast, the fluorocarbon gas provides increased amounts of free fluorine that balances microloading effects. However, excessive amounts of fluorohydrocarbon gas provides etched features having tapered or sloped sidewalls because of the high carbon content that results in increased passivating deposits on the sidewalls of the features. A preferred combination of gases include a fluorocarbon such as $CF_4$, and a fluorohydrocarbon such as $CHF_3$, in a volumetric flow ratio of about 0:1 to about 1:2, and more preferably from about 0.1:1 to about 1:20.

One preferred composition of process gas suitable for etching silicon dioxide layers on a silicon substrate 25 with high selectivity, comprises $CHF_3$, $NH_3$, CO, $CF_4$, and argon. For the volume within the process chamber 50 described herein, (i) a suitable flow rate of fluorohydrocarbon gas, such as $CHF_3$, is from about 5 to about 200 sccm, and more preferably from 10 to 100 sccm; (ii) a suitable flow rate of $NH_3$-generating gas is from about 2 to about 50 sccm, and more preferably from about 4 to about 20 sccm; (iii) a suitable flow rate of CO is from about 0 to about 200 sccm, and more preferably from about 10 to about 100 sccm; (iv) a suitable flow rate of fluorocarbon gas, such as $CF_4$, is preferably from about 0 to about 40 sccm, and more preferably from about 2 to about 20 sccm; and (v) a suitable flow rate of inert gas, such as argon, is from about 5 to about 300 sccm, and more preferably from about 15 to about 200 sccm. Because flow rates are selected depending upon the volume of the chamber 50, the invention should not be limited to the flow rates recited herein.

EXAMPLES

The following illustrative examples of the present invention are shown to etch dielectric layers 20 on semiconductor substrates 25, with high etch rates, and high etching selectivity ratios. However, the apparatus and method of the present invention can be used in other applications as would be apparent to those skilled in the art, and the scope of the present invention should not be limited to the illustrative examples provided herein.

In these examples, the substrates 25 comprised silicon wafers having a diameter of 200 mm (8 inch), and coated with different layers, such as polysilicon, conductivity enhancement layers, or diffusion barrier layers 32, as described below. In each experiment the substrate 25 was placed on the cathode 60 of an MxP OXIDE ETCH chamber 50, the chamber 50 was maintained at a pressure of from about 80 mTorr to about 250 mTorr. Process gas comprising $CHF_3$ and $NH_3$ was used. The substrate 25 was cooled to temperatures ranging within about ±10° C. of the liquefaction temperature $L_T$ of $NH_3$ gas which is about −33° C., using a flow of helium on the backside of the substrate 25 maintained at a pressure of about 8 Torr. A plasma was generated in the plasma zone 55 by applying a RF voltage to the process electrodes 60, 65 in a power level of about 1000 Watts. The plasma was enhanced by applying a rotating magnetic field of about 40 Gauss to the plasma zone 55.

Scanning electron and optical microscopy techniques were used to measure the (i) etch rates of the dielectric, resist, and underlayers, and (ii) etch rate uniformity. Etch rates were calculated by measuring the depth of the features 45 etched in the wafers. The etching selectivity ratio was calculated from the ratio of the etch rate of the dielectric layers 20 to the etch rate of the $TiSi_x$, polysilicon, or resist layers.

Example 1

This example is provided to demonstrate use of a process gas comprising fluorohydrocarbon gas, $NH_3$-generating gas, fluorocarbon gas, and inert gas. In this example, the dielectric layer 20 on the substrate 25 comprised a thermal oxide layer having a thickness of 1 to 2 μm, formed over a polysilicon underlayer 26 having a thickness of about 5000 Å. The dielectric layer 20 was etched to form 0.6 μm diameter contact holes.

A process gas comprising 40 sccm $CHF_3$, 11 sccm $NH_3$, 11 sccm $CF_4$, and 80 sccm Ar was used. This gas composition used a $CHF_3$:$NH_3$ flow ratio of about 4:1. The pressure in the chamber 50 was maintained at 138 mTorr, and the support maintained at a temperature of −30° C. A plasma was formed from the process gas by applying a current at a power level of about 1000 Watts to the electrodes 60, 65 in the process chamber 50, and the plasma was enhanced using a rotating magnetic field having a strength of 38 Gauss.

Example 1 demonstrated the effectiveness of a $CHF_3$:$NH_3$ flow ratio of about 4:1, which provided a silicon dioxide etch rate exceeding 600 nm/minute. In addition, etching selectivity ratios for etching silicon dioxide relative to polysilicon of >100:1 were obtained, and etching selectivity ratios of silicon dioxide to photoresist of ∞:1 were also obtained. Also, etched profile angles greater than 85° were obtained.

Example 2

This example is provided to demonstrate the effect of a different flow ratio of fluorohydrocarbon gas:$NH_3$-generating gas, and to demonstrate use of fluorocarbon gas. In this example, the dielectric layer 20 comprised boron phosphorus silicon glass (BPSG) having a thickness of 1.6 μm, formed over an underlayer 26 comprising TiSi in a thickness of 500 Å.

The process gas comprised 55 sccm $CHF_3$, 11 sccm $NH_3$, 11 sccm $CF_4$, and 80 sccm Ar. This gas composition had a $CHF_3$:$NH_3$ ratio of about 5:1. The pressure in the chamber 50 was maintained at 225 mTorr, and the support maintained at a temperature of −30° C. A plasma was formed from a process gas for applying a current at a power level of about 1000 Watts to the electrodes 60, 65 in the process chamber 50, and the plasma was enhanced using a rotating magnetic field having a strength of 38 Gauss.

Example 2 demonstrated the effectiveness of a $CHF_3$:$NH_3$ ratio of about 5:1 for etching of contact holes having a diameter of 0.4 μm in a BPSG layer. BPSG etching rates greater than 900 nm/minute were obtained, and the etching selectivity ratio of BPSG to $TiS_2$ was greater than 25:1. The etching process also provided average profile angles of greater than 86°.

Example 3

This example is provided to demonstrate the effect of a different flow ratio of fluorohydrocarbon gas:$NH_3$-generating gas, in a process gas comprising fluorocarbon gas. In this example, the substrate 25 comprised a dielectric layer 20 of silicon oxide in a thickness of 1.6 μm deposited on a titanium nitride layer having a thickness of 500 Å. Via holes having a diameter of about 0.4 μm were etched in the dielectric layer 20.

A process gas comprising 33 sccm $CHF_3$, 11 sccm $NH_3$, 5 sccm $CF_4$, and 66 sccm Ar, was used. This gas composition provided a $CHF_3$:$NH_3$ flow ratio of about 3:1, and a $CHF_3$:$CF_4$ flow ratio of about 6.6:1. The pressure in the chamber 50 was maintained at 138 mTorr, and the support maintained at a temperature of −30° C. A plasma was formed from a process gas by applying a current at a power level of about 1000 Watts to the electrodes 60, 65 in the process chamber 50, and the plasma was enhanced using a rotating magnetic field having a strength of 38 Gauss.

In example 3, the silicon dioxide dielectric layer was etched at etch rates greater than 900 nm/minute, and an etching selectivity ratio of silicon dioxide to TiN of greater than 30:1 was obtained. The etched features 45 had a profile angle of greater than 89°.

Example 4

This example is provided to demonstrate use of a process gas comprising fluorohydrocarbon gas, $NH_3$-generating gas, carbon-oxygen gas, fluorocarbon gas, and inert gas, to show the advantages of adding carbon-oxygen gas to the process gas.

The process gas comprised 40 sccm $CHF_3$, 11 sccm $NH_3$, 40 sccm CO, 11 sccm $CF_4$, and 80 sccm Ar. This gas composition provided a $CHF_3$:$NH_3$ ratio of about 4:1, and a CO:$CHF_3$ ratio of about 1:1. The pressure in the chamber 50 was maintained at 138 mTorr, and the support maintained at a temperature of −30° C. A plasma was formed from a process gas by applying a current at a power level of about 1000 Watts to the electrodes 60, 65 in the process chamber 50, and the plasma was enhanced using a rotating magnetic field having a strength of 38 Gauss.

This example provided an etching selectivity ratio of etching silicon oxide to polysilicon of ∞:1, which is a significant improvement over conventional processes. In addition, silicon oxide etch rates of greater than 600 nm/minute were obtained. The extremely high polysilicon etching selectivity ratio in combination with high silicon dioxide etching rates, provides a large process window for processing the substrate 25 in a range of different process conditions without significantly reducing the etching rate of the silicon dioxide layer. This is a particularly useful feature for tailoring the gas composition for highly selective etching of different material combinations at high etch rates.

The present invention is to an etching process that uses a novel gas chemistry and process conditions to obtain dielectric etching rates of up to 900 nm/minute (9000 Å/minute); etching selectivity ratios exceeding 100:1, and often as high as ∞:1; and etching profile angles higher than 85°. It has been discovered that the combination of a fluorohydrocarbon and $NH_3$-generating gas, preferably $CHF_3$ and $NH_3$, provide excellent dielectric etch rates without sacrificing the etching selectivity ratio to resist or polysilicon. It has further been discovered that the dielectric and polysilicon etch rates change in nonlinear U-shaped curve for increasing flow ratios of fluorohydrocarbon:$NH_3$-generating gas, and at preferred flow ratios ranging from about 2.5:1 to 7:1 provide unusually high dielectric etch rates and etching selectivity ratios. The addition of carbon-oxygen gas to the fluorohydrocarbon and $NH_3$-generating process gas provides wide processing windows, by providing high dielectric etch rates over a range of processing conditions, without sacrificing etching selectivity ratios. The unusual advantages obtained from this combination of process gas is not taught or recognized by the prior art, and results in significant improvements in the field of etching dielectric.

Although the present invention has been described in considerable detail with regard to the preferred versions thereof, other versions are possible. For example, gases equivalent in function or composition to the fluorohydrocarbon gas, $NH_3$-generating gas, or carbon-oxygen gas can also be used, and the etching process can be used to etch different materials, such as for example silicides, borides, nitrides, and carbides. Therefore, the appended claims should not be limited to the description of the preferred versions contained herein.

What is claimed is:

1. A method of selectively etching a substrate having a dielectric layer with resist thereon, the method comprising the steps of:

(a) placing the substrate in a process zone;

(b) introducing into the process zone, a process gas comprising (i) fluorohydrocarbon gas for forming fluorine-containing etchant species capable of etching the dielectric layer, (ii) $NH_3$-generating gas having a liquefaction temperature $L_T$ in a range of temperatures $\Delta T$ of from about $-60°$ C. to about $20°$ C., the volumetric flow ratio of fluorohydrocarbon gas to $NH_3$-generating gas being from about 2.5:1 to about 7:1, and (iii) carbon-oxygen gas, the volumetric flow ratio of carbon-oxygen gas to fluorohydrocarbon gas being from about 0.1:1 to about 1:1;

(c) maintaining the substrate at temperatures within about $\pm 50°$ C. of the liquefaction temperature $L_T$; and (d) forming a plasma from the process gas to etch the dielectric layer on the substrate at an etch rate of greater than 600 nm/minute, and an etching selectivity ratio for etching dielectric relative to underlying polysilicon of substantially $\infty$:1.

2. The method of claim 1, wherein the $NH_3$-generating gas comprises a sticking coefficient of at least about 0.1, and wherein at least a portion of the gas chemically adheres to the substrate surface at the liquefaction temperatures of the gas, thereby enhancing the etching rate of the dielectric layer.

3. The method of claim 1, wherein the $NH_3$-generating gas is selected from the group consisting of $NH_3$, $NH_4OH$, $CH_3NH_2$, $C_2H_5NH_2$, $C_3H_8NH_2$, and mixtures thereof.

4. The method of claim 1, wherein the fluorohydrocarbon gas is selected from the group consisting of $CHF_3$, $CH_3F$, $C_2HF_5$, $C_2H_2F_2$, $C_2H_4F_2$, and mixtures thereof.

5. The method of claim 1, wherein the carbon-oxygen gas is selected from the group consisting of CO, $CO_2$, HCOOH, HCHO, $CH_3COOH$, and $CH_3OH$.

6. The method of claim 1, wherein the process gas further comprises fluorocarbon gas absent hydrogen that is selected from the group consisting of $CF_4$, $C_2F_6$, $C_3F_8$, $C_4F_8$, $C_4F_{10}$, and mixtures thereof.

7. The method of claim 6, wherein the fluorohydrocarbon gas comprises $CHF_3$, and the fluorocarbon gas comprises $CF_4$, and wherein the volumetric flow ratio of $CF_4$:$CHF_3$ is from about 0:1 to about 1:2.

8. The method of claim 1, wherein the process gas further comprises an inert gas selected from the group consisting of argon, xenon, neon, krypton, and helium, and wherein the volumetric flow ratio of inert:fluorohydrocarbon gas is from about 1:1 to about 3:1.

9. The method of claim 1, wherein the dielectric layer is selected from the group consisting of silicon dioxide, undoped silicate glass, phophosilicate glass, borophosphosilicate glass, and combinations thereof.

10. A method of selectively etching dielectric comprising silicon oxide or silicon nitride layers on underlying polysilicon on a substrate, the method comprising the steps of:

(a) placing the substrate in a process zone;

(b) introducing into the process zone, a process gas comprising (i) fluorohydrocarbon gas selected from the group consisting of $CHF_3$, $CH_3F$, $C_2HF_5$, $C_2H_2F_2$, and $C_2H_4F_2$, (ii) fluorocarbon gas absent hydrogen selected from the group consisting of $CF_4$, $C_2F_6$, $C_3F_8$, $C_4F_8$ and $C_4F_{10}$, (iii) $NH_3$, (iv) CO, and (v) inert gas, wherein the volumetric flow ratio of fluorohydrocarbon gas to $NH_3$ is from about 2.5:1 to about 7:1, the volumetric flow ratio of fluorocarbon gas to fluorohydrocarbon gas is from about 0:1 to about 1:2, and the volumetric flow ratio of CO to fluorohydrocarbon gas is from about 0.1:1 to about 1:1; and (c) forming a plasma from the process gas to etch the dielectric at an etch rate of greater than 600 nm/minute, and an etching selectivity ratio for etching dielectric relative to underlying polysilicon of substantially $\infty$:1.

11. The method of claim 10, wherein the substrate is maintained at temperatures within about $\pm 50°$ C. of a liquefaction temperature $L_T$ of the $NH_3$ gas.

12. A method of treating a substrate comprising silicon dioxide or silicon nitride layers over underlying polysilicon, the method comprising the steps of:

(a) placing the substrate in a process zone;

(b) introducing into the process zone, a process gas comprising (i) $CHF_3$, (ii) $CF_4$, (iii) $NH_3$, (iv) CO, and (v) inert gas, wherein the volumetric flow ratio of $CHF_3$:$NH_3$ is from about 2.5:1 to about 7:1, the volumetric flow ratio of $CF_4$:$CHF_3$ is from about 0:1 to about 1:2, and the volumetric flow ratio of CO:$CHF_3$ is from about 0.1:1 to about 1:1; and (c) forming a plasma from the process gas to etch the silicon oxide or silicon nitride layers at an etch rate of greater than 600 nm/minute, and an etching selectivity ratio relative to polysilicon of substantially $\infty$:1.

13. The method of claim 12, wherein the substrate is maintained at temperatures within about $\pm 50°$ C. of a liquefaction temperature $L_T$ of the $NH_3$ gas.

* * * * *